United States Patent
Burns et al.

(10) Patent No.: US 6,952,134 B2
(45) Date of Patent: *Oct. 4, 2005

(54) PROTECTION CIRCUIT FOR EXTENDING HEADROOM WITH OFF-CHIP INDUCTORS

(75) Inventors: Lawrence M. Burns, Laguna Hills, CA (US); Leonard Dauphinee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/742,942

(22) Filed: Dec. 23, 2003

(65) Prior Publication Data

US 2004/0135636 A1 Jul. 15, 2004

Related U.S. Application Data

(63) Continuation of application No. 09/912,551, filed on Jul. 26, 2001, now Pat. No. 6,683,498, which is a continuation-in-part of application No. 09/897,601, filed on Jul. 3, 2001, now Pat. No. 6,512,416.
(60) Provisional application No. 60/221,617, filed on Jul. 28, 2000, and provisional application No. 60/215,850, filed on Jul. 3, 2000.

(51) Int. Cl.[7] .................................................. H03F 3/45
(52) U.S. Cl. ....................... 330/261; 330/253; 327/562
(58) Field of Search ................................ 327/333, 562, 327/563, 307; 330/253, 261, 277, 286, 295, 298, 310, 254, 278; 326/90

(56) References Cited

U.S. PATENT DOCUMENTS

| 4,461,964 A | 7/1984 | Shiotari ...................... 327/208 |
| 4,881,044 A | 11/1989 | Kinoshita et al. ........... 330/253 |
| 5,177,378 A | 1/1993 | Nagasawa ..................... 326/83 |
| 5,196,805 A | 3/1993 | Beckwith et al. ........... 330/277 |
| 5,432,478 A | 7/1995 | Gilbert ....................... 330/284 |
| 5,550,511 A | 8/1996 | Miyashita ................... 330/253 |
| 5,684,431 A | 11/1997 | Gilbert et al. .............. 330/254 |
| 5,999,028 A | 12/1999 | Knoch et al. ................. 326/29 |
| 6,002,356 A | 12/1999 | Cooper ....................... 341/159 |
| 6,023,192 A * | 2/2000 | Didier ........................ 330/254 |
| 6,232,908 B1 | 5/2001 | Nakaigawa .................. 341/155 |
| 6,255,906 B1 | 7/2001 | Eidson et al. ........... 330/124 R |
| 6,313,704 B1 * | 11/2001 | Maruyama et al. ......... 330/259 |
| 6,377,117 B2 | 4/2002 | Oskowsky et al. ........... 330/51 |
| 6,639,468 B2 * | 10/2003 | Belot ......................... 330/252 |

FOREIGN PATENT DOCUMENTS

GB  1 585 079  2/1981  ............. H03F/1/08

OTHER PUBLICATIONS

U.S. Appl. No. 09/438,687, filed Nov. 1999, Bult et al.
Sam, B., "Direct Conversion Receiver for Wide-band CDMA," Wireless Symposium, pp. 1–5, (Spring 2000).
Copy of Internal Search Report from International Application No. PCT/US01/41418, filed Jul. 26, 2001, 6 pages (mailed: Apr. 11, 2003).

* cited by examiner

*Primary Examiner*—Tuan T. Lam
(74) *Attorney, Agent, or Firm*—Sterne, Kessler, Goldstein & Fox P.L.L.C.

(57) ABSTRACT

A protection circuit for extending the dynamic range of an amplifier circuit is described. Off-chip impedances, such as inductors, cause the output of the circuit to swing above and below the bias voltage. A protection circuit is included, either on-chip or off-chip, to protect the integrated circuit components if there is a fault condition in either of the off-chip impedances.

19 Claims, 16 Drawing Sheets

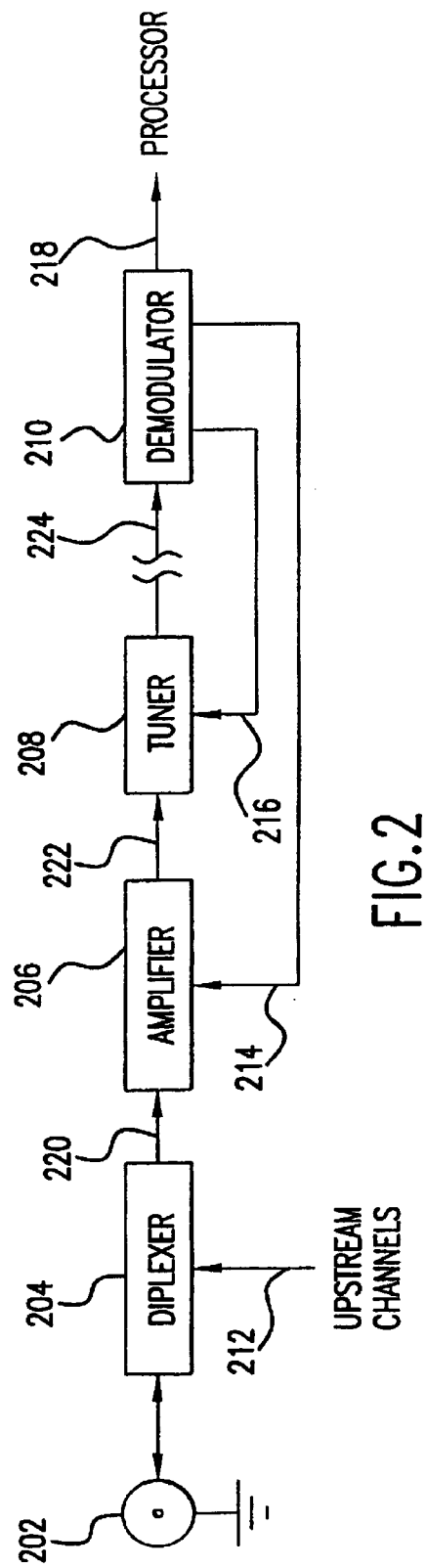

PROTECTION CIRCUIT FOR EXTENDING HEADROOM WITH OFF-CHIP INDUCTORS

CROSS-REFERENCE TO OTHER APPLICATIONS

This application is a continuation of U.S. application Ser. No. 60/221,551, filed on Jul. 26,2001, now U.S. Pat. No. 6,683,498, which claims the benefit of U.S. Provisional Application No. 60/221,617, filed Jul. 28, 2000, and further U.S. application Ser. No. 09/912,551 is a continuation-in-part of U.S. application Ser. No. 09/897,601, filed Jul. 3, 2001, now U.S. Pat. No. 6,512,416, which itself claims the benefit of U.S. Provisional Application No. 60/215,850, filed Jul. 3, 2000, and U.S. Provisional Application No. 60/221, 617, filed Jul. 28, 2000, all of which are incorporated herein in their entirety.

BACKGROUND OF THE INVENTION

1. Field of the Invention

The invention generally relates to variable gain amplifiers and applications of the same. In an embodiment, the variable gain amplifier is used in a set-top control box for the delivery of cable television service to a customer. In another embodiment, the variable gain amplifier is used in a cable modem.

2. Related Art

In modern sub-micron semiconductor processes, power supply voltages continue to be reduced. In an example used herein, the power supply voltage is 3.3V. This is less than the more common value of 5V used by most bipolar processes. More recent complementary metal-oxide-semiconductor (CMOS) processes operate at 1.2V. Because of this reduced power supply voltage, it is no longer possible to "stack" transistors on top of one another to improve bandwidth and linearity. There is simply not enough voltage dynamic range. In fact, even a simple differential amplifier may not have enough dynamic range to operate properly when the signals at the output have large amplitudes.

The need for very good linearity is even more striking when the input to the chip is single-ended, rather than differential. This requires even more dynamic range at the output of the amplifier. Being able to apply single-ended signals to the chip avoids the cost of an external balun transformer. What is needed is a system and method for improving the dynamic range of an amplifier while providing protection to the on-chip components.

SUMMARY OF THE INVENTION

This invention uses external surface mount inductors or surface mount ferrite beads to connect the output nodes of multiple differential amplifiers to $V_{DD}$ (the positive power supply). The external inductors or ferrites provide a short-circuit at DC and a high impedance over a range of operating frequencies (e.g., 50–860 MHz). This allows for much greater dynamic range on the internal differential pairs.

A further feature of this invention is a special on-chip biasing arrangement at the output that prevents damage from occurring to the chip, should one of the above-mentioned inductors or ferrites not be installed, or become an open-circuit.

BRIEF DESCRIPTION OF THE FIGURES

FIG. 2 illustrates an exemplary Community Antenna Television (CATV);

DETAILED DESCRIPTION OF THE PREFERRED EMBODIMENTS

Figure 1:
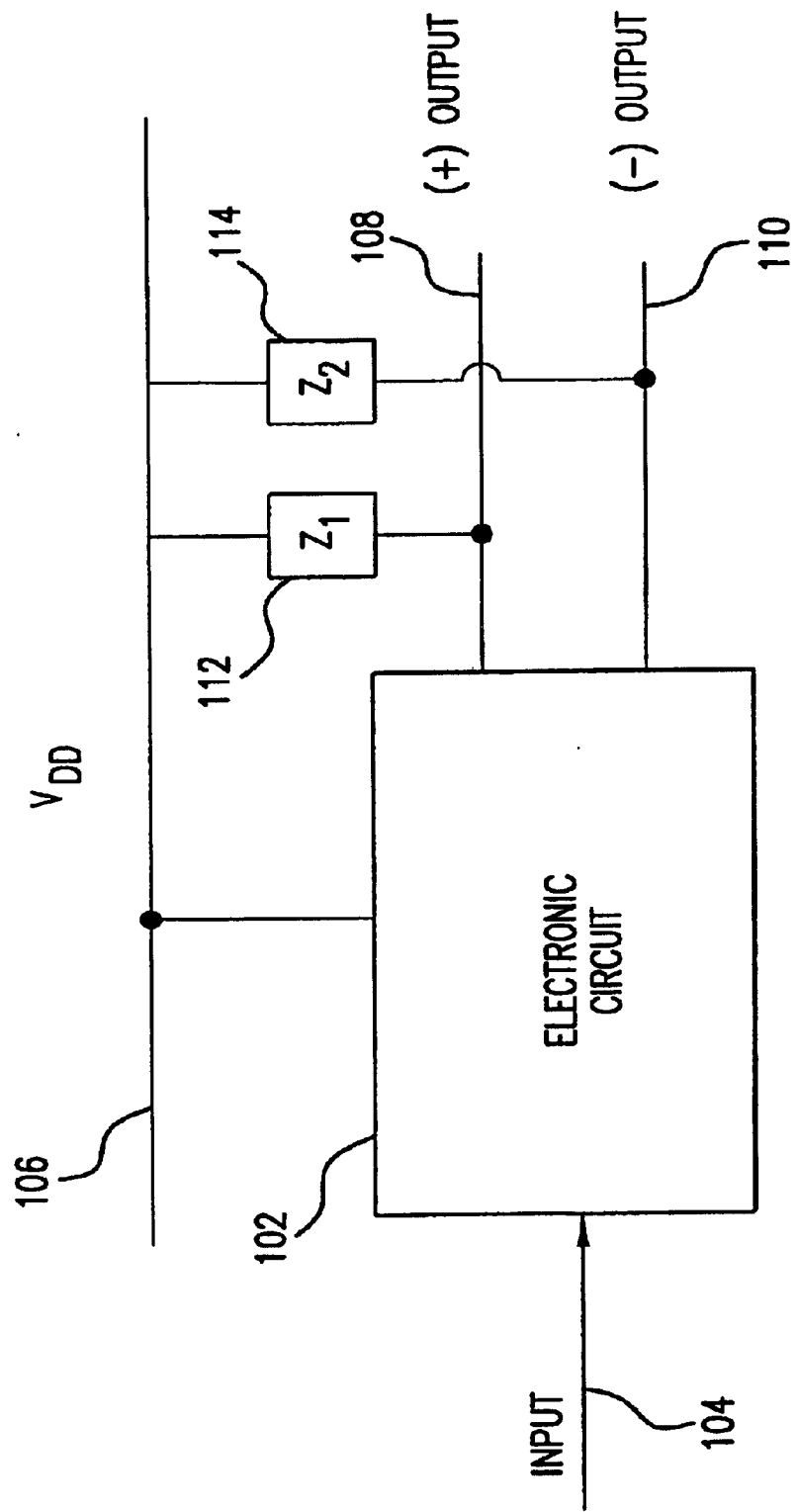
FIG. 1 illustrates an electronic circuit in an embodiment of the present invention.

Looking first at FIG. 1, an exemplary circuit depicting an embodiment of the invention is illustrated. An electronic circuit 102 is seen receiving an input 104. Input 104 can be a single input or a differential input. Electronic circuit 102 is further connected to a bias voltage 106. Bias voltage 106 is shown as $V_{DD}$ and is the common direct current (DC) voltage for the overall circuit for which electronic circuit 102 is a part. Electronic circuit 102 is shown having a differential output comprising a positive output 108 and a negative output 110. One skilled in the art(s) will appreciate, based on the teachings contained herein, that the invention will also apply to an electronic circuit having a single output. Positive output 108 is connected to bias voltage 106 through a first impedance 112, and negative output 110 is connected to bias voltage 106 through a second impedance 114. First impedance 112 and second impedance 114 have substantially zero DC voltage drop and are substantially an open circuit to signals in the frequency range of interest.

Looking now to FIG. 2, an example of a community antenna television (CATV) system (also referred to as cable television) is shown. A CATV cable 202 is shown connected to a diplexer 204. Diplexer 204 includes filters (not shown) that permit upstream channels 212 to be passed to cable 202 and allow downstream channels 220 to be passed to an amplifier 206. Preferably, for the U.S. and Canada, the up-stream channels cover from 5–42 MHz and the down-stream channels cover from 54–860 MHz. Concentrating on the down-stream, the output of amplifier 206 is an amplified signal 222 that is routed to a tuner 208. Tuner 208 includes at least one bandpass filter that selects a single down-stream channel 224 having a 6 MHz bandwidth. In embodiments, down-stream channel 224 is centered at 44 MHz. Down-stream channel 224 is then routed to a demodulator 210, which outputs a demodulated signal 218 for further processing before being sent to a user device (e.g. television set or computer). As an example, and not meant to be limiting, demodulated signal 218 can be digital video or cable modem data. Demodulator 210 also analyzes the power of down-stream channel 224 and outputs a feedback 216 to control an amplifier (not shown) in tuner 208 and outputs a feedback 214 to control amplifier 206.

Figure 3A:
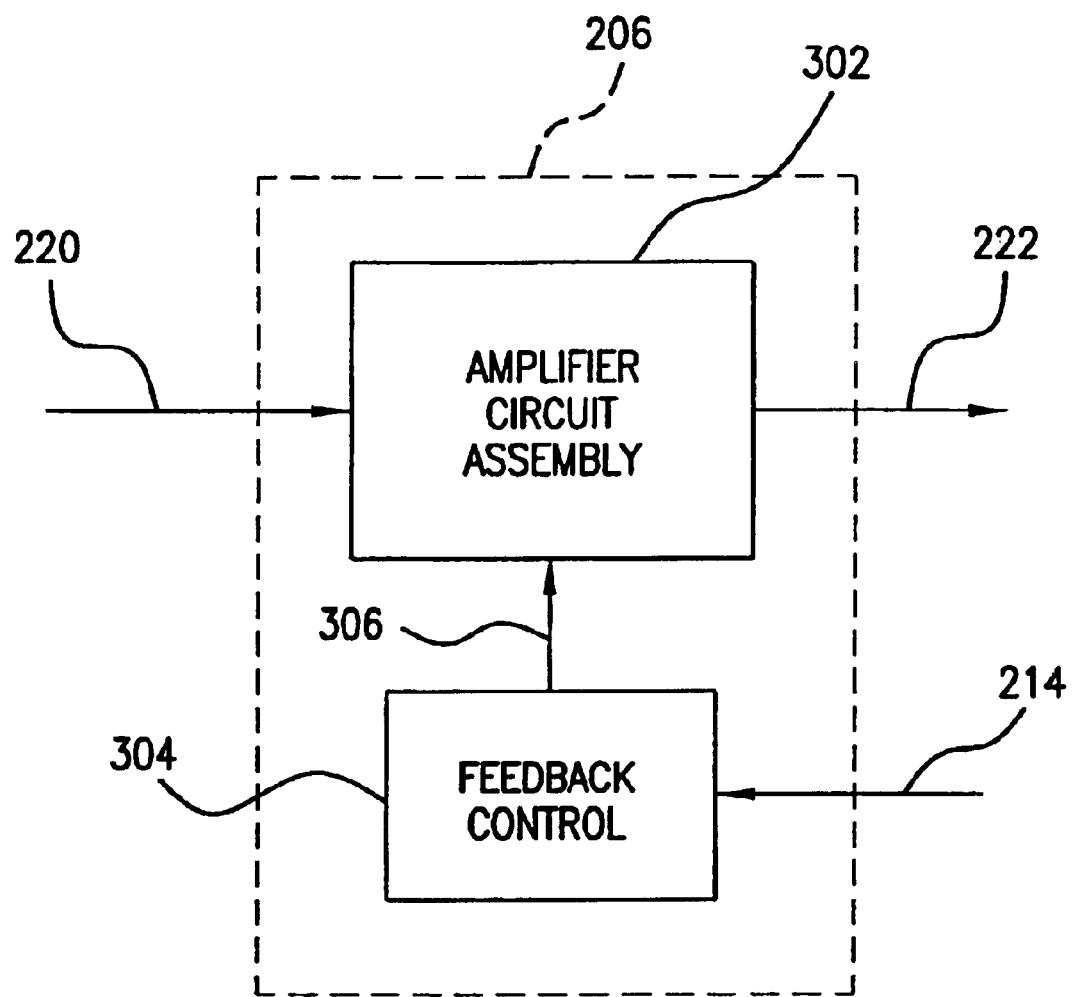
FIGS. 3A–3B illustrate two embodiments of the amplifier of FIG. 2.

In FIG. 3A, an embodiment of amplifier 206 is illustrated. Amplifier 206 is comprised of an amplifier circuit assembly 302 that receives downstream channels 220. Amplifier circuit assembly 302 also receives a control signal 306 from a feedback control 304. Feedback control 304 is controlled by feedback 214. Further details of the purpose and operation of feedback control 304 and control signal 306 are presented in U.S. patent application "Extended Range Variable Gain Amplifier," Application Ser. No. 09/897,601, filed Jul. 3, 2001, incorporated herein by reference in its entirety. Amplifier circuit assembly 302 outputs amplified signal 222.

Figure 3B:
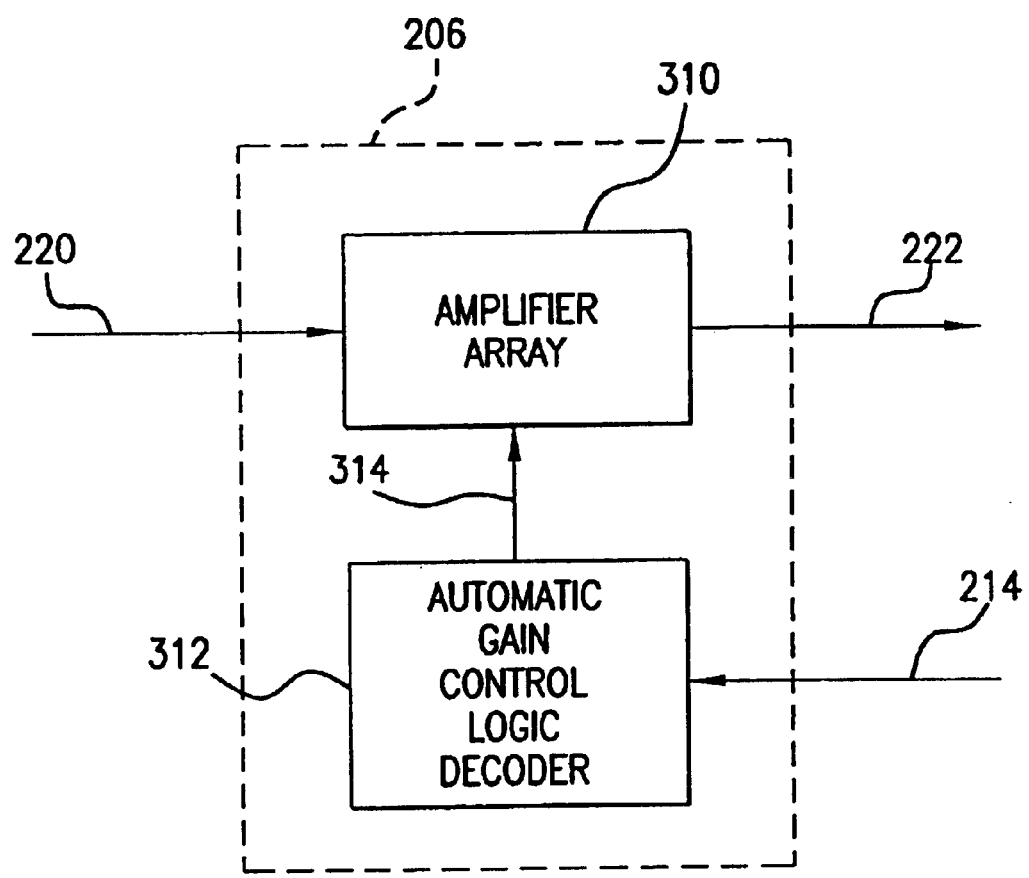

A second embodiment is illustrated in FIG. 3B. Amplifier 206 is shown comprising an amplifier array 310 and an automatic gain control (AGC) logic decoder 312. Amplifier array receives downstream channels 220 and outputs amplified signal 222. Amplifier array 310 also receives AGC control signal 314 from AGC logic decoder 312 under the control of feedback 214. Further details of the purpose and operation of AGC logic decoder 312 and AGC control signal 314 are presented in U.S. patent application "Extended Range Variable Gain Amplifier," Application Ser. No. 09/897,601, filed Jul. 3, 2001, incorporated herein by reference in its entirety.

Figure 4A:
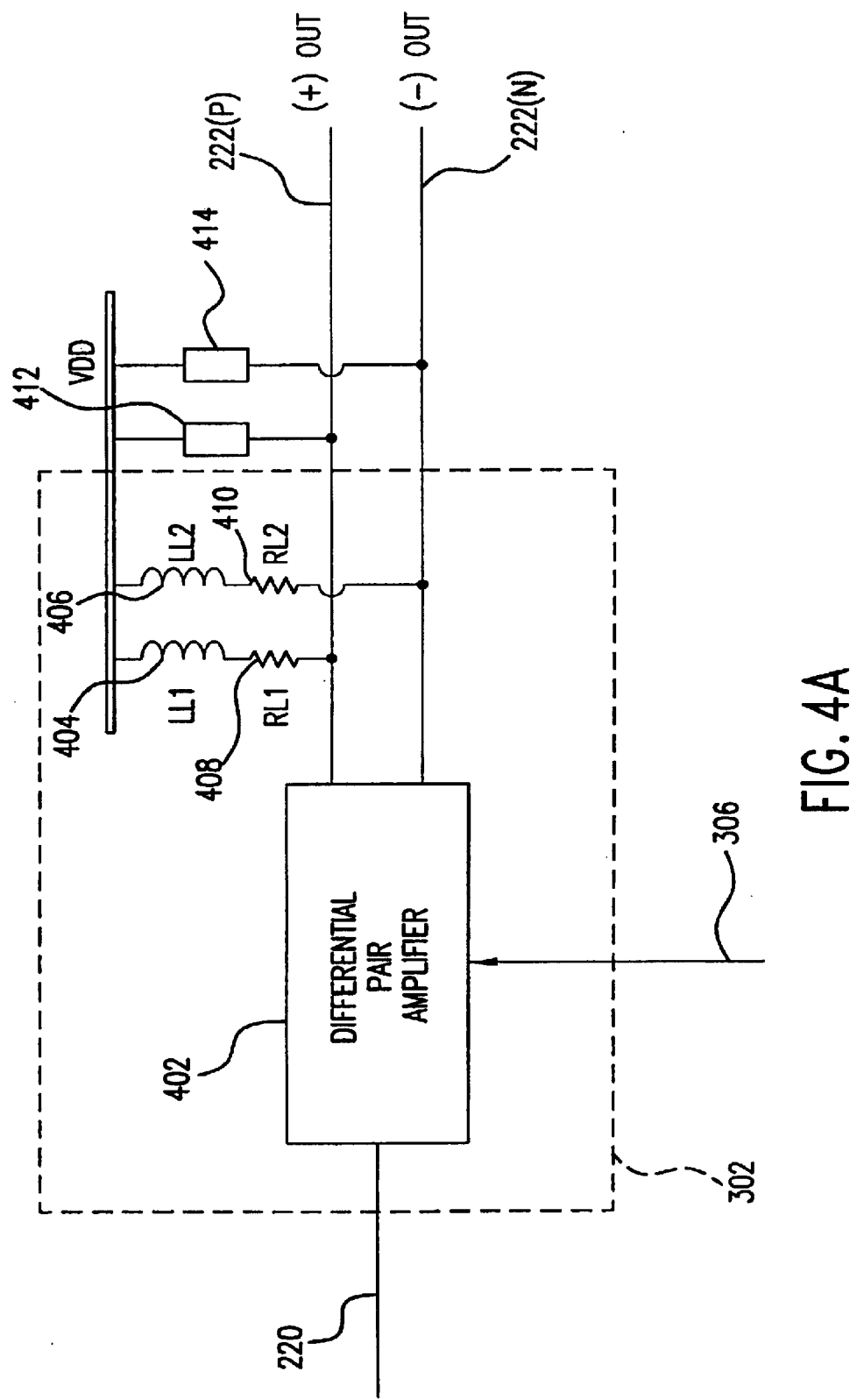
FIG. 4A illustrates one embodiment of the present invention wherein the amplifier circuit assembly of FIG. 3A is depicted.

Amplifier circuit assembly 302 is illustrated in FIG. 4A as comprising a differential pair amplifier 402 having a positive amplified signal 222(P) and a negative amplified signal 222(N). Within amplifier circuit assembly 302, positive amplified signal 222(P) is seen being connected to $V_{DD}$ through a first load inductor 404 and a first load resistor 408 (illustrated as LL1 and LR1, respectively), and negative amplified signal 222(N) is seen being connected to $V_{DD}$ through a second load inductor 406 and a second load resistor 410 (illustrated as LL2 and LR2, respectively). External to amplifier circuit assembly 302, positive amplified signal 222(P) is shunted through a first impedance 412 to $V_{DD}$ and negative amplified signal 222(N) is shunted through a second impedance 414 to $V_{DD}$. First impedance 412 and second impedance 414 are selected such that they provide substantially zero impedance to DC voltage and provide a substantially high impedance to signals in the frequency range of interest. In an embodiment, amplifier circuit assembly 302 is disposed on a common integrated circuit (IC) substrate and first impedance 412 and second impedance 414 are mounted external to the common substrate.

Figure 4B:
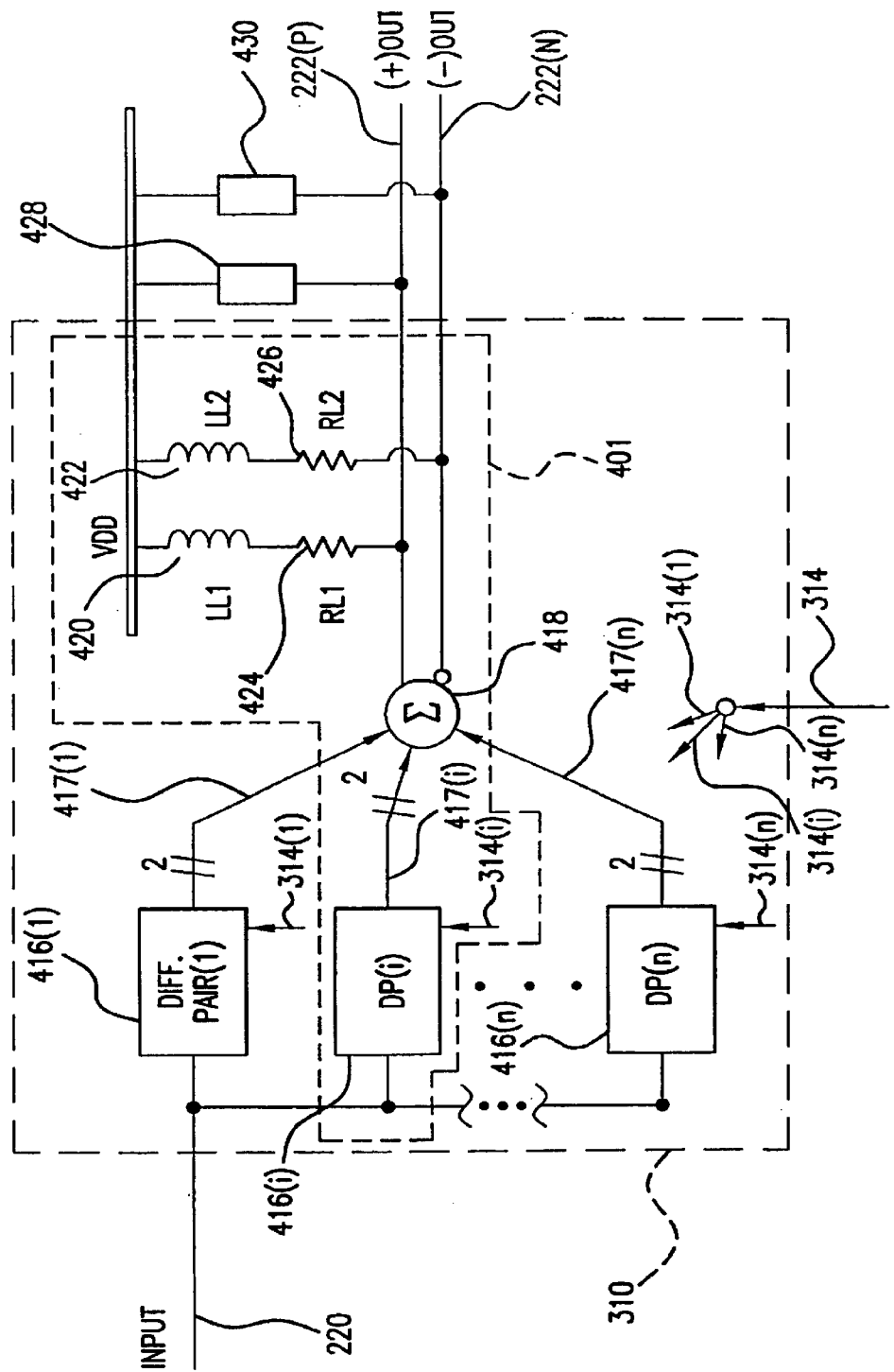
FIG. 4B illustrates one embodiment of the present invention wherein the amplifier array of FIG. 3B is depicted.

Amplifier array 310 is further illustrated in FIG. 4B. Downstream channels 220 are accepted by amplifier array 310 and routed to each of a plurality of differential pair amplifiers 416(l) through 416(n). In an implementation, some inputs can be attenuated through a resistor ladder (typically on-chip). The output of any differential pair amplifier 416(i) is a differential pair output signal 417(i). Differential pair output signal 417(i) through 417(n) are routed to a combiner 418. In one embodiment, combiner 418 is a summer. Combiner 418 combines differential pair output signals 417(i) and outputs positive amplified signal 222(P) and negative amplified signal 222(N). Positive amplified signal 222(P) is seen being connected to $V_{DD}$ through a first load inductor 420 and a first load resistor 424 (illustrated as LL1 and LR1, respectively), and negative amplified signal 222(N) is seen being connected to $V_{DD}$ through a second load inductor 422 and a second load resistor 426 (illustrated as LL2 and LR2, respectively). External to amplifier array 310, positive amplified signal 222(P) is shunted through a first impedance 428 to $V_{DD}$ and negative amplified signal 222(N) is shunted through a second impedance 430 to $V_{DD}$. First impedance 428 and second impedance 430 are selected such that they provide substantially zero impedance to DC voltage and provide a substantially high impedance to signals in the frequency range of interest. In an embodiment, amplifier circuit assembly 310 is disposed on a common integrated circuit (IC) substrate and first impedance 428 and second impedance 430 are mounted external to the common substrate.

Figure 4C:
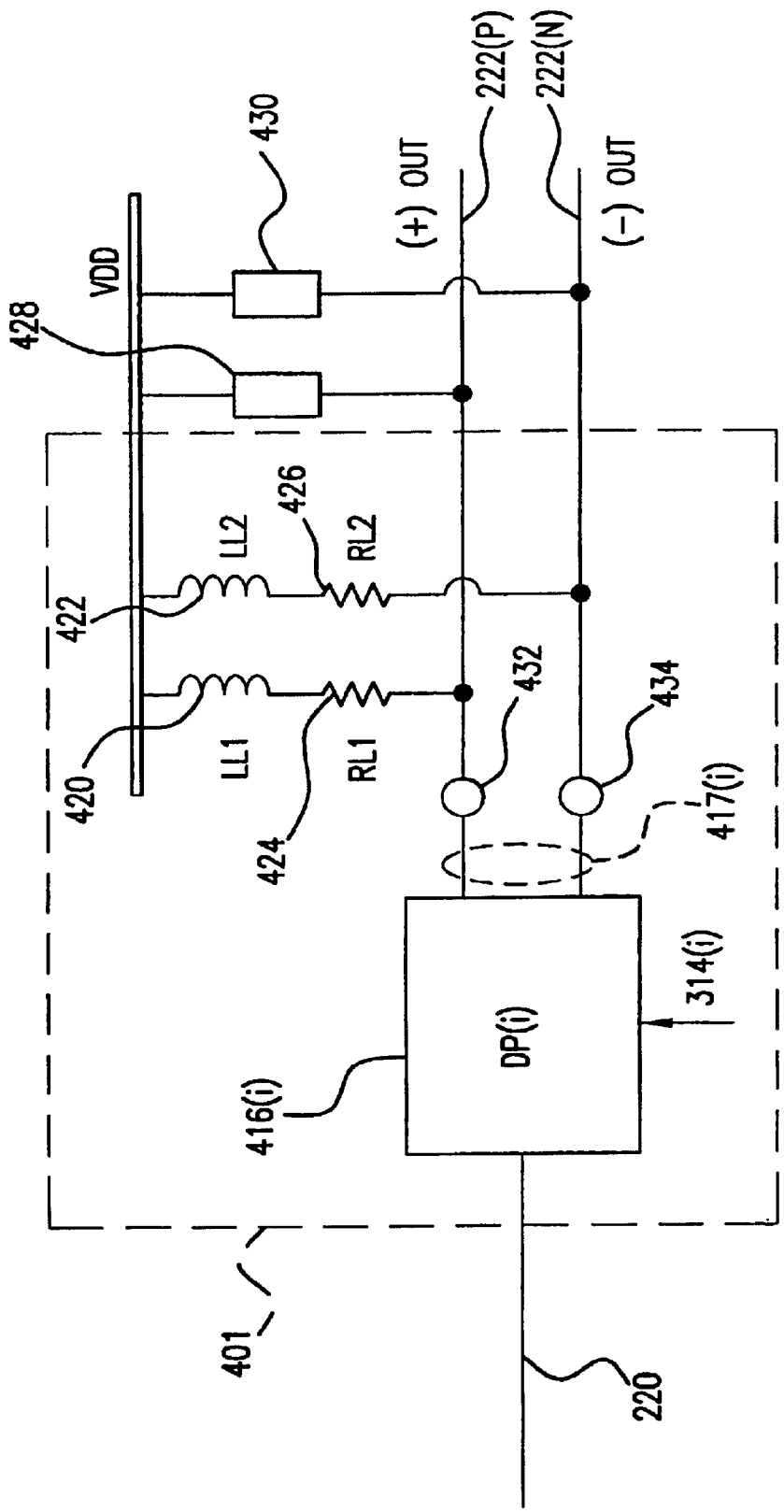
FIG. 4C illustrates a typical differential pair amplifier of the amplifier array depicted in FIG. 4B.

A representative amplifier circuit assembly 401 is illustrated in FIG. 4C. Nodes 432 and 434 illustrate the combining of the plurality of differential pair output signals 417(i), wherein node 432 is the positive node outputting positive amplified signal 222(P) and node 434 is the negative node outputting negative amplified signal 222(N).

Figure 5:
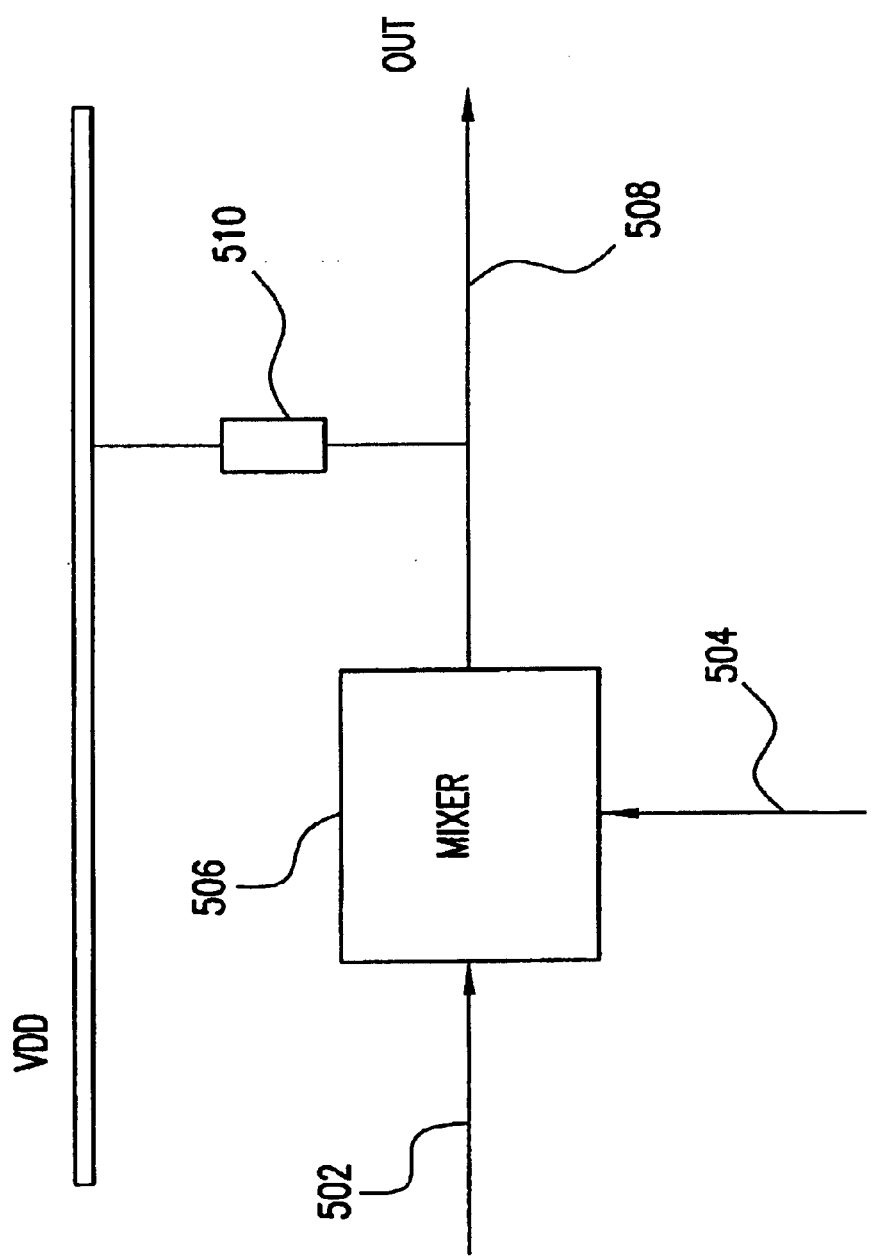
FIG. 5 illustrates a mixer used in an embodiment of the present invention.

FIG. 5 illustrates an alternate embodiment of the invention. In FIG. 5, a mixer 506 is illustrated receiving an input signal 502 and a mixing signal 504. Mixer 506 outputs a mixed output signal 508. Mixed output signal 508 is connected through an impedance 510 to $V_{DD}$. Impedance 510 is selected such that it provides substantially zero impedance to DC voltage and provides a substantially high impedance to signals in the frequency range of interest. Mixed output signal 508 is shown as being a single output. Those skilled in the relevant art(s) will appreciate, based on the teachings contained herein, that the invention with respect to the mixer embodiment also applies to the implementation wherein mixed output signal 508 is a differential output.

The circuits shown in FIGS. 4A–4C illustrate downstream channels 220 as being a single input signal. The invention also applies to the implementation wherein downstream channels 220 is a differential input, as will be understood by those skilled in the art(s), based on the teachings contained herein.

Figure 6:
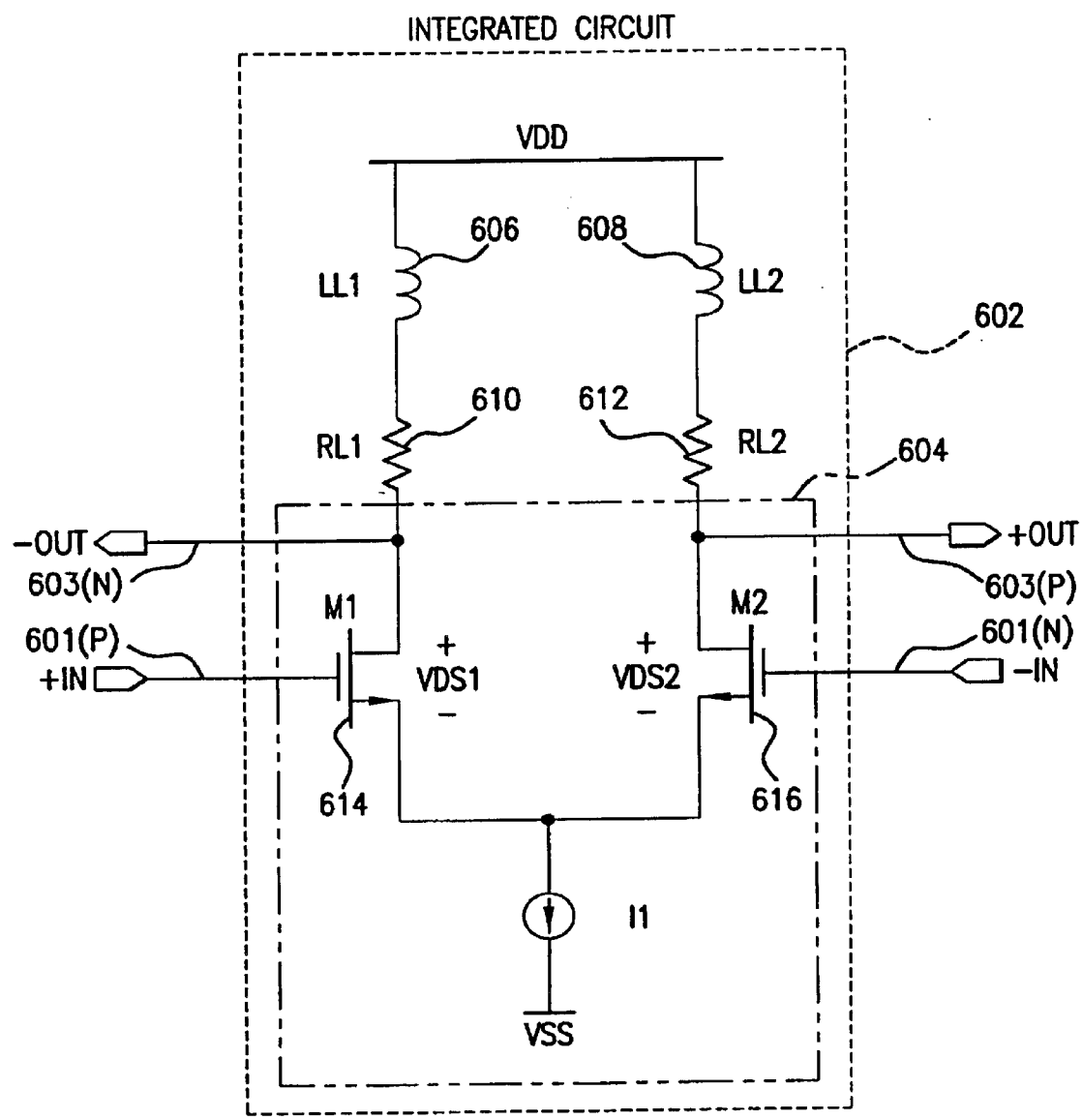
FIG. 6 illustrates a typical integrated circuit having a differential pair amplifier coupled to on-chip impedances.

FIG. 6 illustrates an example of amplifier circuit assembly 302 and representative amplifier circuit assembly 401. FIG. 6 depicts a typical integrated circuit 602 as comprising a differential pair 604, a first load inductor 606, a first load resistor 610, a second load inductor 608, and a second load resistor 612. Differential pair 604 further comprises a pair of transistors 614 and 616. Transistors 614 and 616 have a common source tied to $V_{SS}$. Transistor 614 is shown accepting a positive input signal 601(P) and transistor 616 is shown accepting a negative input signal 601(N). Transistor 614 is shown having a negative output 603(N) and transistor 616 is shown having a positive output 603(P). Negative output 603(N) is connected through first load inductor 606 and first load resistor 610 to $V_{DD}$ and positive output 603(P) is connected through second load inductor 608 and second load resistor 612 to $V_{DD}$.

Figure 7:
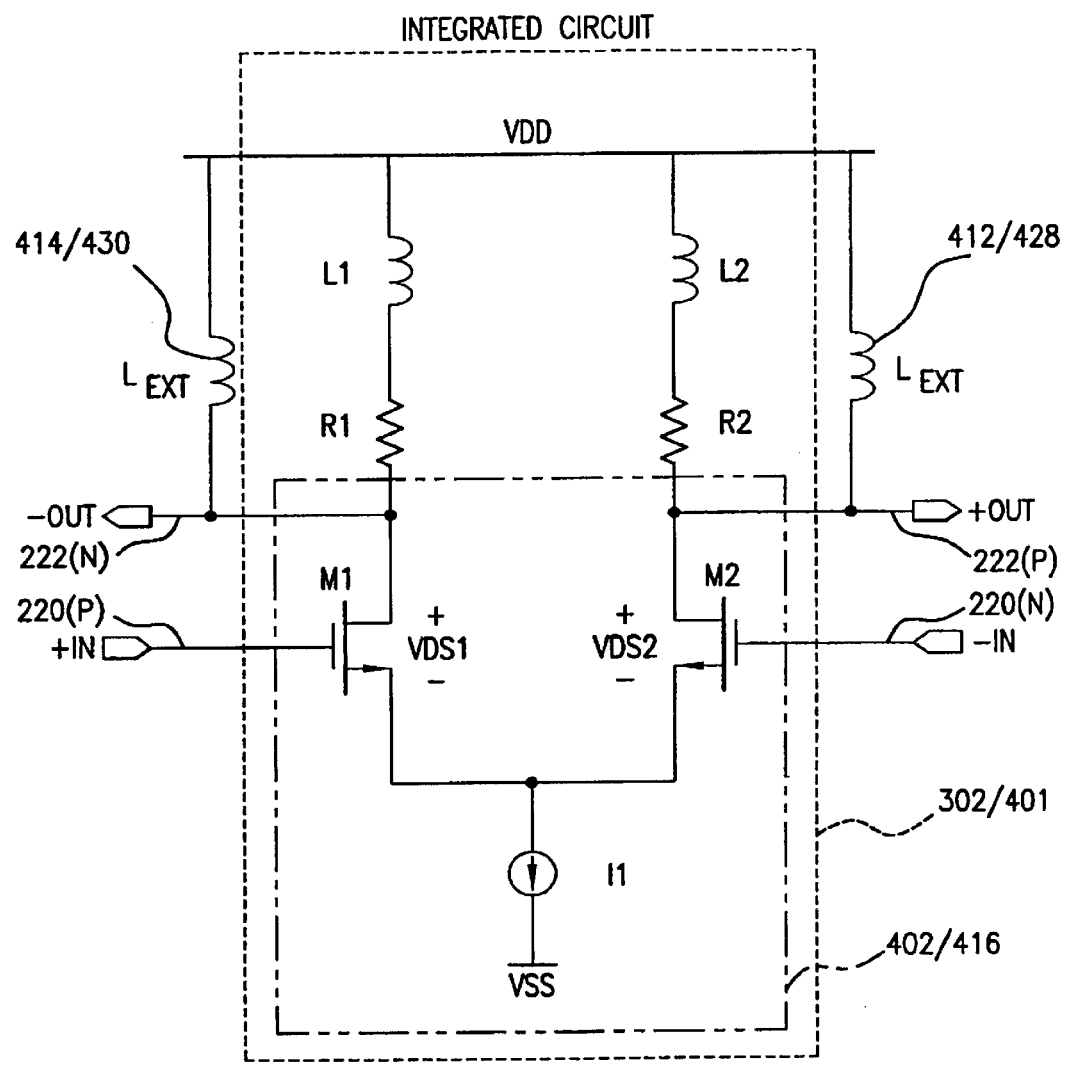
FIG. 7 illustrates an integrated circuit having a differential pair amplifier coupled to on-chip impedances and to off-chip inductors.

FIG. 7 expands on FIG. 4A and FIG. 4C and illustrates an integrated circuit connected according to an embodiment of the present invention. Amplifier circuit assembly 302;401 is comprised of on-chip resistors and inductors (shown as R1, R2, L1, and L2 in FIG. 7), and differential pair amplifier 402;416 receiving differential downstream channels 220(P) and 220(N). Differential pair amplifier 402;416 is further comprised of transistors receiving differential downstream channels 220(P) and 220(N) at their respective gates, further configured with a common source connected to $V_{SS}$, and having the output signals 222(N) and 222(P) found at the drain. Output signal 222(P) is connected through first impedance 412;428 to VDD, and output signal 222(N) is connected through second impedance 414;430 to VDD. In this embodiment, first impedance 412;428 and second impedance 414;430 are shown as inductors, although other impedances (such as those that provide a substantially short circuit to DC voltage while being a high impedance to signals in the frequency range of interest) may be used, as will be apparent to those skilled in the art(s). Further, the components of amplifier circuit assembly 302;401 are preferably mounted on a common IC substrate, whereas first impedance 412;428 and second impedance 414;430 are preferably mounted external to the common substrate.

Figure 8:
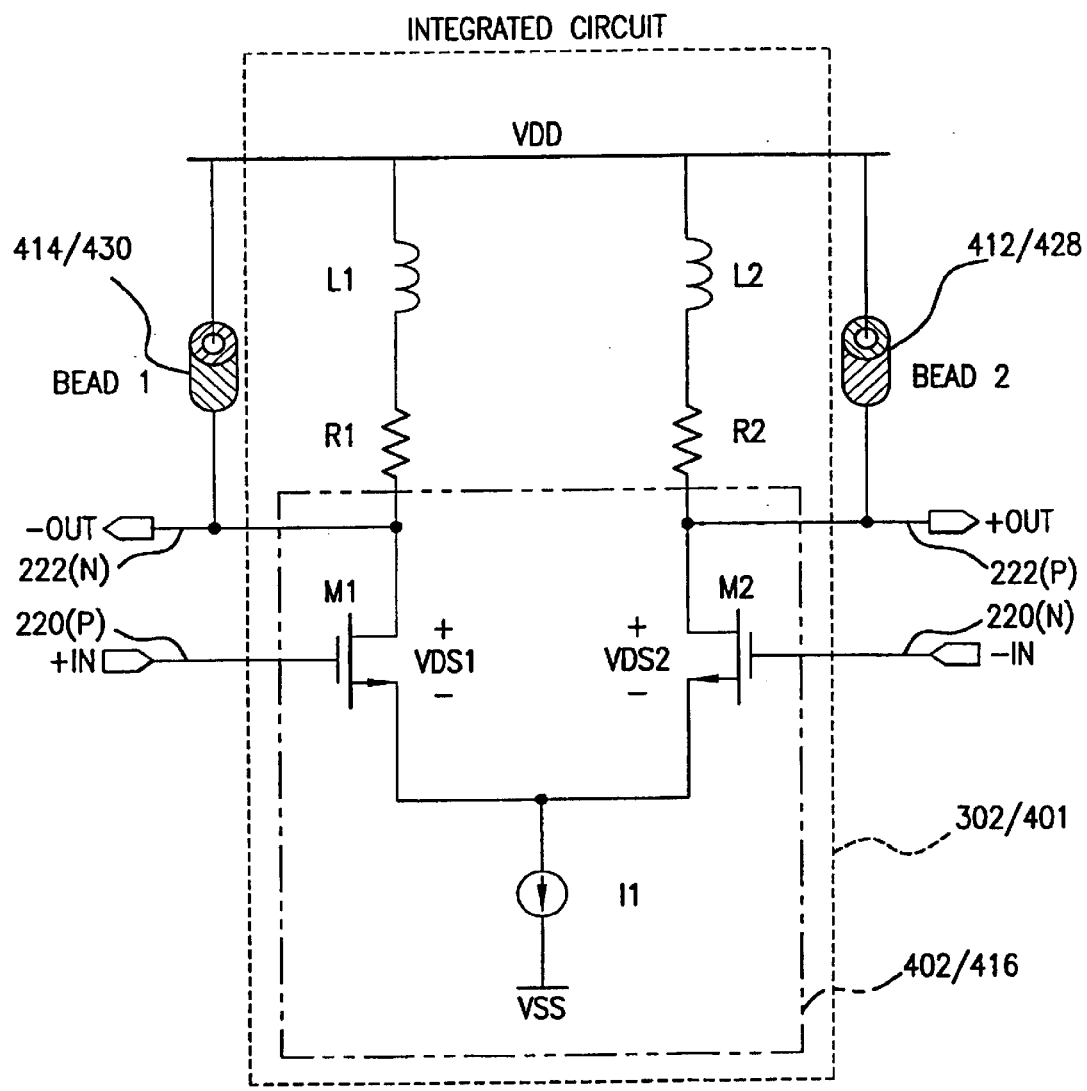
FIG. 8 illustrates an integrated circuit having a differential pair amplifier coupled to on-chip impedances and to off-chip ferrite beads.

FIG. 8 expands on FIG. 4A and FIG. 4C and illustrates an integrated circuit connected according to a second embodiment of the present invention. Amplifier circuit assembly 302;401 is comprised of on-chip resistors and inductors (shown as R1, R2, L1, and L2 in FIG. 7), and differential pair amplifier 402;416 receiving differential downstream channels 220(P) and 220(N). Differential pair amplifier 402;416 is further comprised of transistors receiving differential downstream channels 220(P) and 220(N) at their respective gates, further configured with a common source connected to $V_{SS}$, and having the output signals 222(N) and 222(P) found at the drain. Output signal 222(P) is connected through first impedance 412;428 to VDD, and output signal 222(N) is connected through second impedance 414;430 to VDD. In this second embodiment, first impedance 412;428 and second impedance 414;430 (which are shown as inductors in FIG. 7) are shown as ferrite beads, although the invention is not limited to this embodiment, as will be apparent to those skilled in the art(s). Further, the components of amplifier circuit assembly 302;401 are preferably mounted on a common IC substrate, whereas first impedance 412;428 and second impedance 414;430 are prerably mounted external to the common substrate.

In the following discussion, values have been selected to illustrate the present invention. These values of voltage, resistance, inductance, and current are provided for purposes of illustration only. They are not meant to be limiting.

Figure 9A:
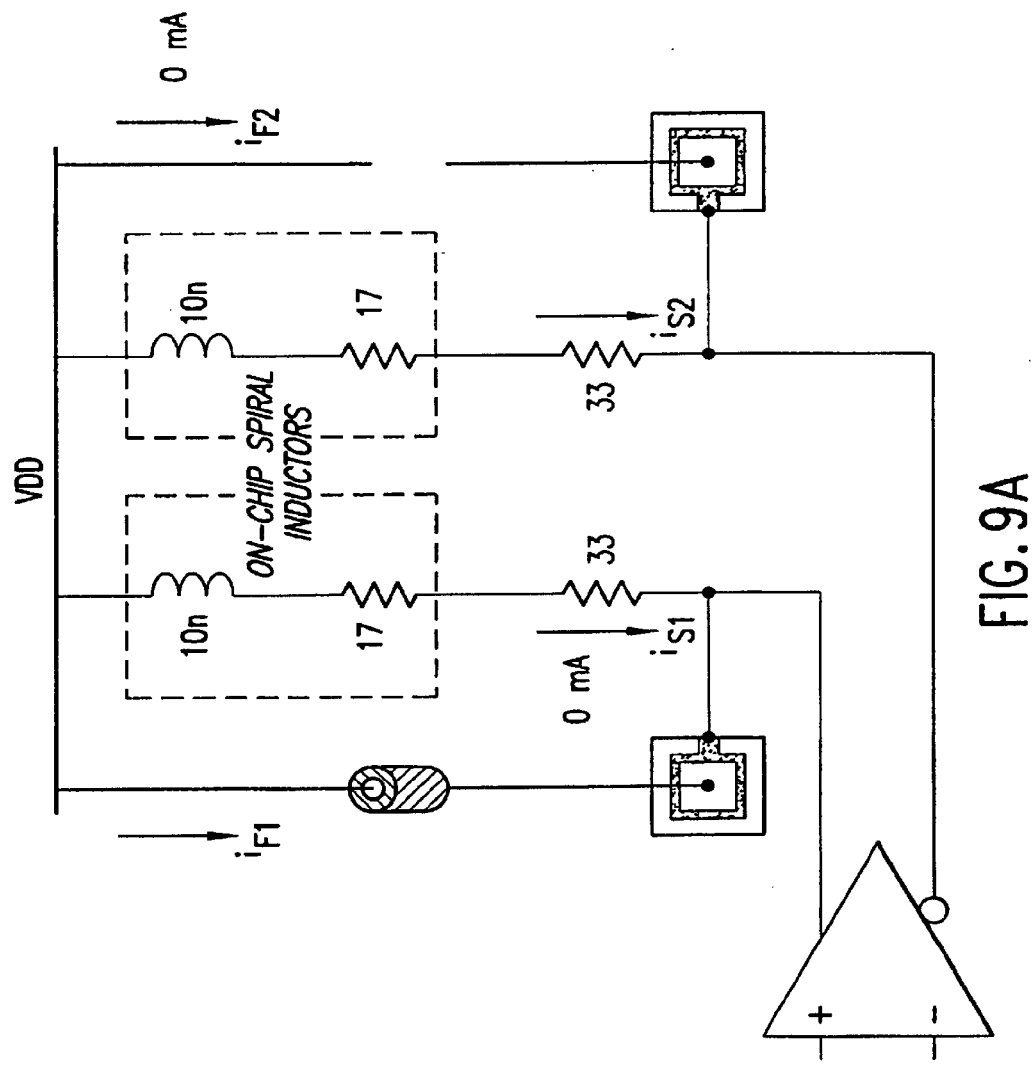
FIG. 9A illustrates an embodiment of the present invention wherein one ferrite bead has failed.

In the circuit of FIG. 8, wherein the outputs of the amplifier circuit assembly are connected through the external ferrite beads to $V_{DD}$, and for the example where $V_{DD}$ is 3.3 volts, the DC current flowing through the ferrite beads ($i_{F1}$ and $i_{F2}$) is 49.3 mA, and the DC current flowing through the on-chip spiral inductors ($i_{S1}$ and $i_{S2}$) is zero amps. In FIG. 9A, a circuit is shown for the example wherein the ferrite beads have a minimum inductance of 1 µH and the on-chip spiral inductors have a value of 10 nH with a total series resistance of 50 Ω. In FIG. 9A, one of the beads has failed and is open circuited, and thus $i_{F2}$ is 0 amps. As a result of the bead failing, $i_{F1}$ will be 59.7 mA, $i_{S2}$ will be 38.4 mA, and $i_{S1}$ remains at 0 mA. The value of $i_{S2}$ of 38.4 mA exceeds the desired design limit of the spiral inductor, and may damage the entire chip.

Figure 9B:
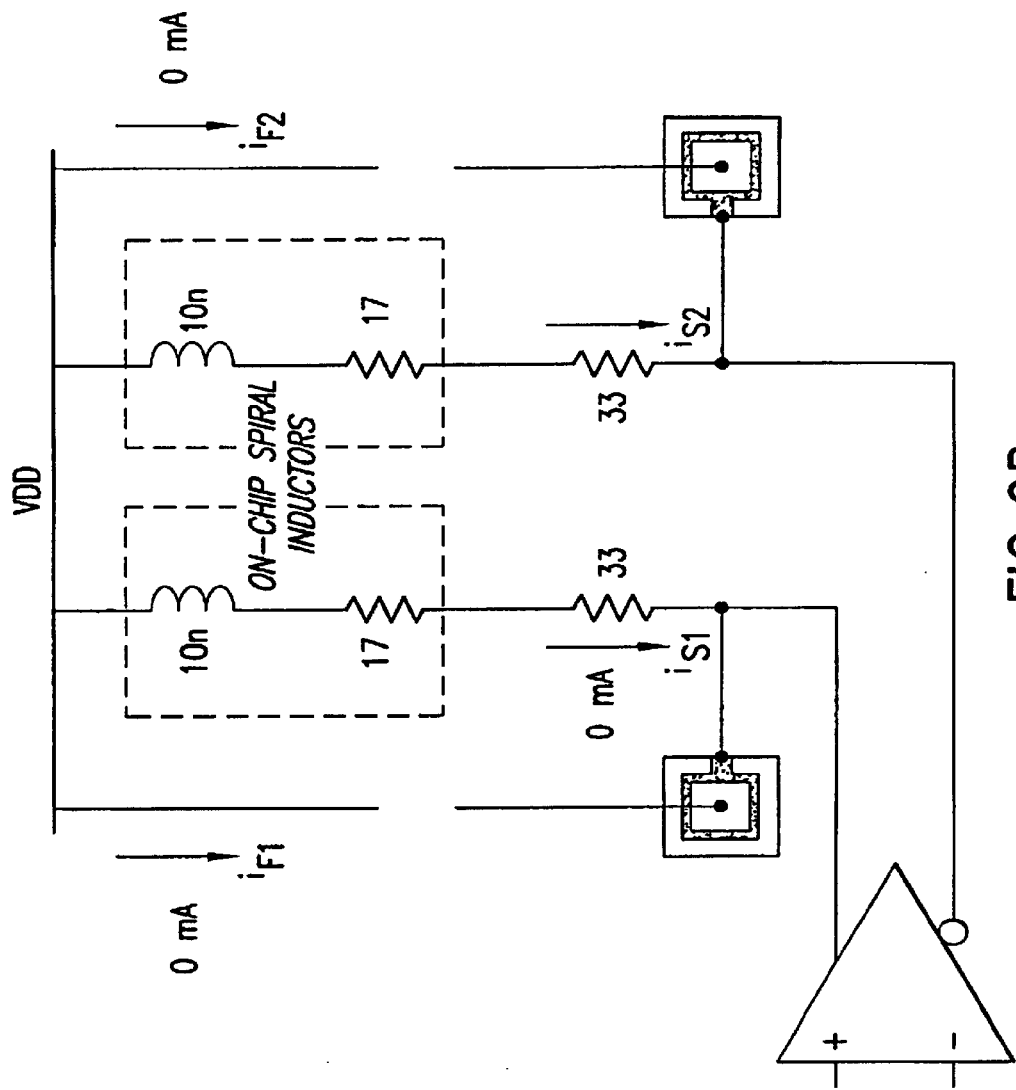
FIG. 9B illustrates an embodiment of the present invention wherein both ferrite beads have failed.

In FIG. 9B, the example wherein both ferrite beads have failed is shown. In this example, both $i_{F1}$ and $i_{F2}$ will be 0 mA, while $i_{S1}$ and $i_{S2}$ will be 47.2 mA. Again, this current exceeds the desired design limit of the spiral inductor, and may damage the chip. What is needed is an enhancement to the circuit that will keep is, and $i_{S2}$ below the desired design limit of the spiral inductor.

Figure 10:
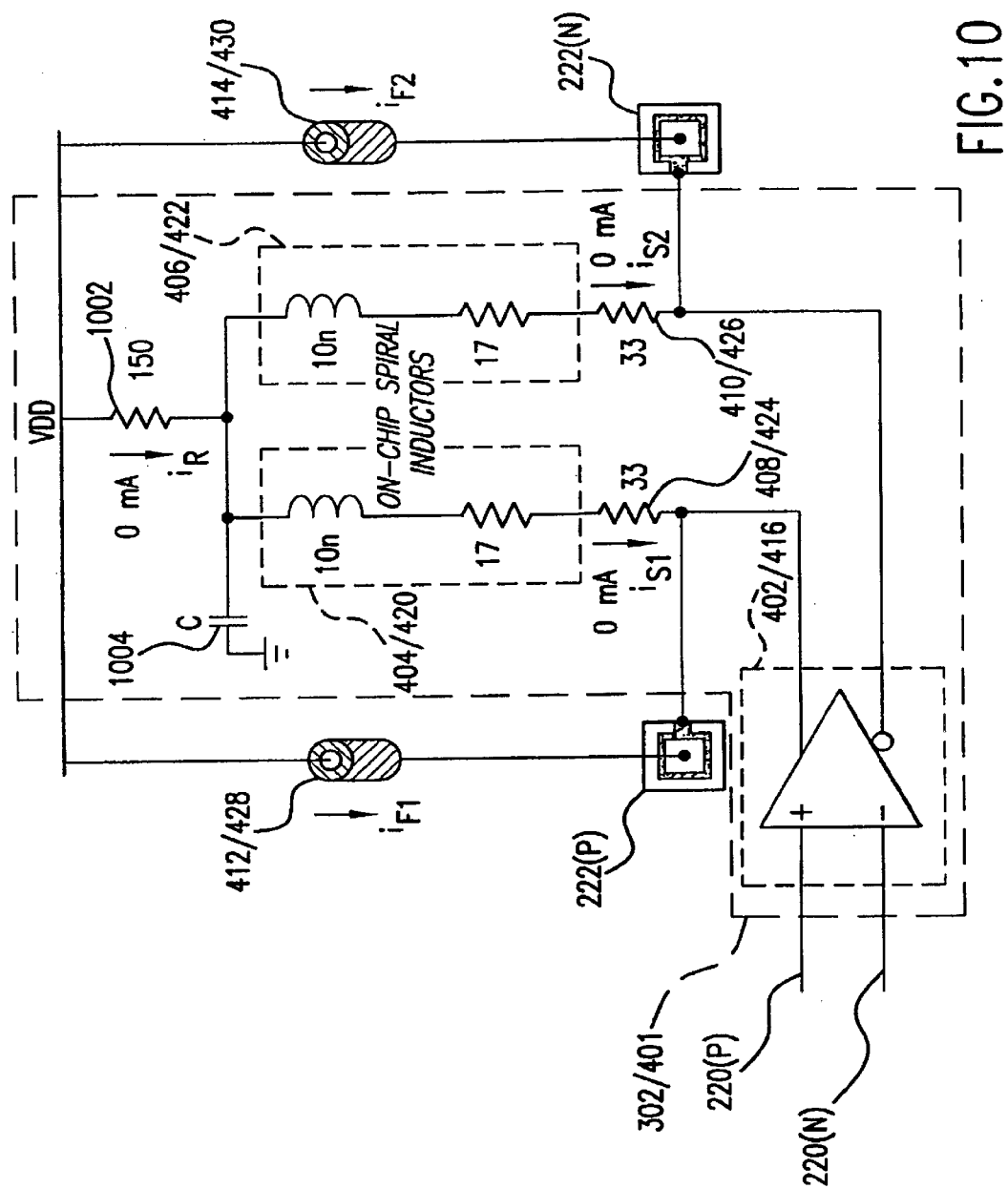
FIG. 10 illustrates an embodiment of the present invention having a protection circuit disposed.

Looking now to FIG. 10, an alternate embodiment of the present invention is illustrated. An on-chip resistor 1002 is connected between a common node of first load inductor 404;420 and second load inductor 406;422 and $V_{DD}$. An exemplary value for on-chip resistor 1002 is 150 Ω. Also connected to the same node is an on-chip capacitor 1004. On-chip capacitor 1004 is further connected to a potential that is substantially equal to ground at the frequency range of interest. In this example, $i_{F1}$ and $i_{F2}$ will be 49.3 mA, while $i_{S1}$, $i_{S2}$, and $i_R$ will be 0 mA.

Figure 11A:
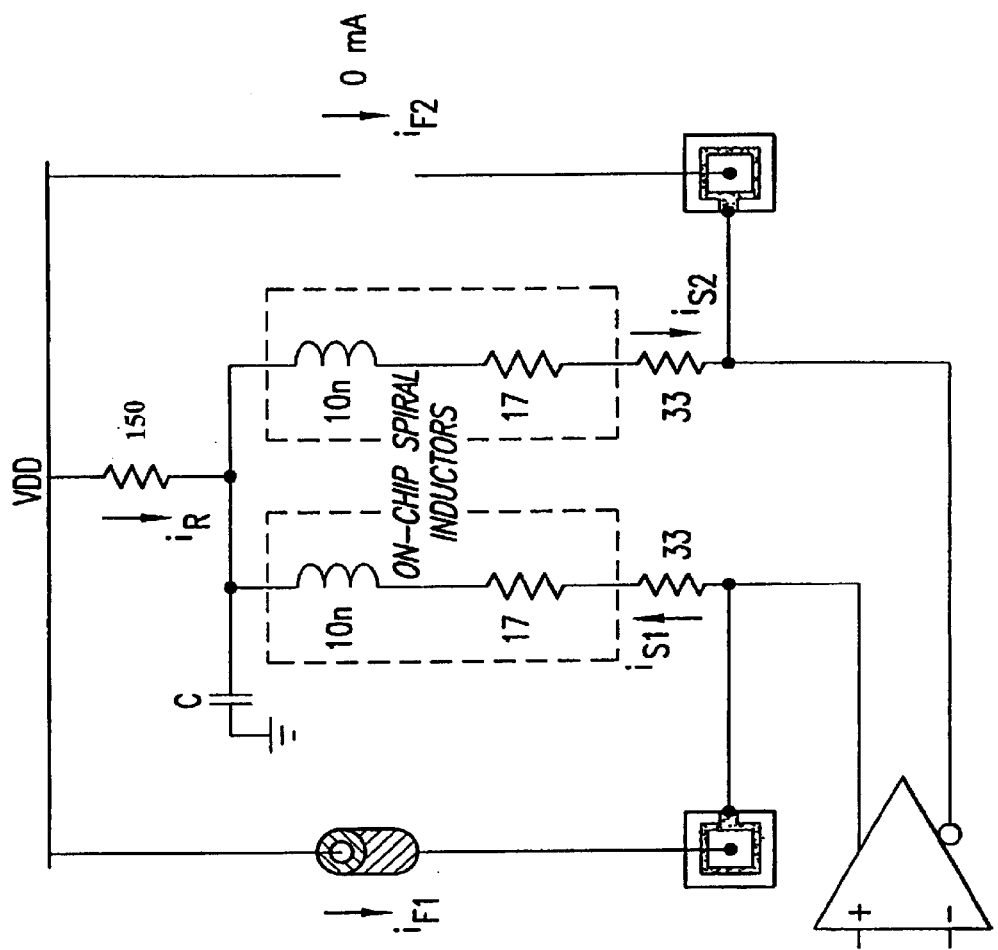
FIG. 11A illustrates an embodiment of the present invention having a protection circuit disposed thereon, wherein one ferrite bead has failed.

Looking now to FIG. 11A, the condition wherein one ferrite bead fails is shown. In this example, $i_{F2}$ will be 0 mA, while $i_{F2}$ will be 91.3 mA, $i_{S2}$ will be 24.6 mA, $i_{S1}$ will be 18.4 mA (in the direction shown by the arrow), and $i_R$ will be 6.1 mA. Thus, the maximum current flowing through either inductor will be 24.6 mA, which is within the desired design limit of the spiral inductor. As a result, if a single ferrite bead fails, the addition of on-chip resistor 1002 and on-chip capacitor 1004 will protect the chip from damage.

Figure 11B:
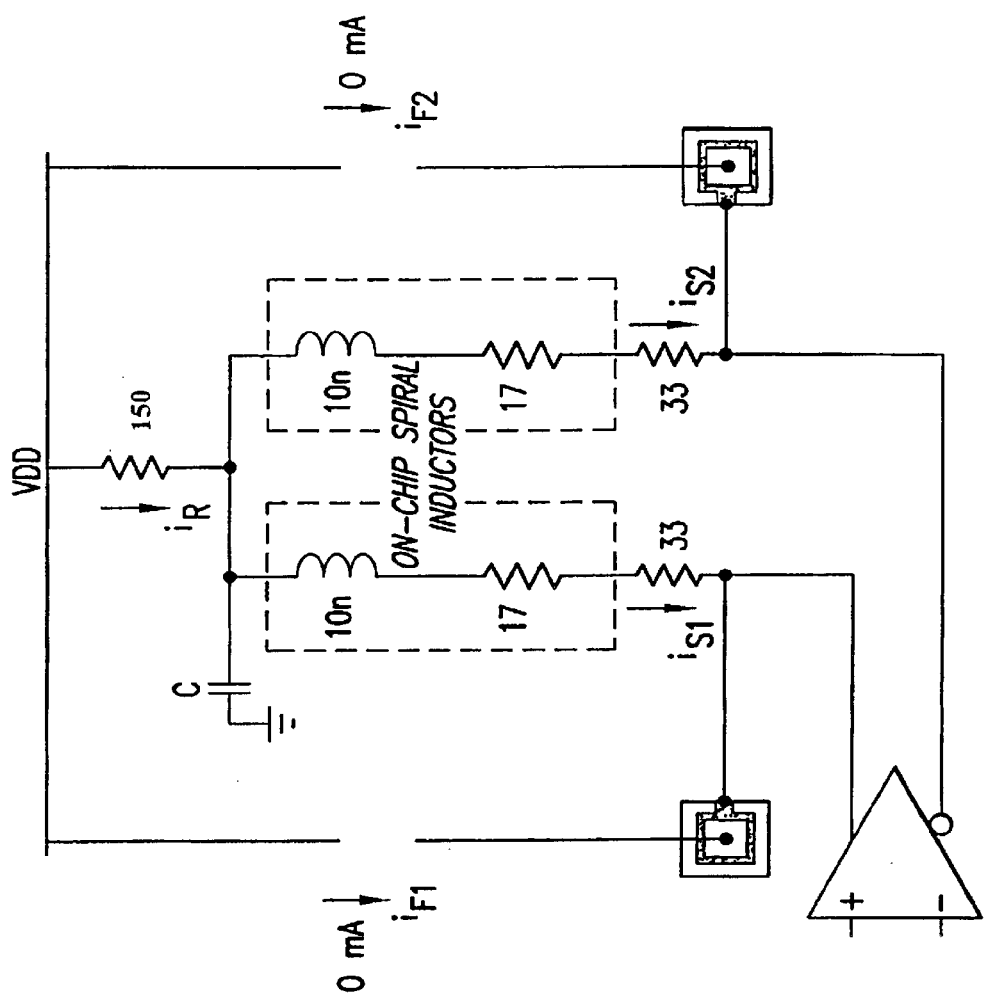
FIG. 11B illustrates an embodiment of the present invention having a protection circuit disposed thereon, wherein both ferrite beads have failed.

In FIG. 11B, the condition wherein both ferrite beads fail is shown. In this example, $i_{F1}$ and $i_{F2}$ will be zero and $i_{S1}$ and $i_{S2}$ will be 9.2 mA. The current through on-chip resistor 1002 will be 18.4 mA. Thus, the maximum current flowing through either inductor will be 9.2 mA, which is within the desired design limit of the spiral inductor. As a result, if both ferrite beads fail, the addition of on-chip resistor 1002 and on-chip capacitor 1004 will protect the chip from damage.

In each of the examples given above, the values are provided for purpose of illustration and not limitation. One skilled in the relevant art(s) will understand, based on the teachings contained herein, that a change in the value of the bias voltage will result in a change in the values of the currents through the components of the circuits. Further, the value of the on-chip resistor is provided for purpose of illustration and not limitation, and other values of resistance can be used without deviating from the spirit and intent of the invention. These alternate values of resistance would also change the currents through the various components of the circuit.

It should be understood that the invention also covers the embodiment wherein on-chip resistor 1002 and on-chip capacitor 1004 are added to the circuit in an off-chip configuration. Similarly, the invention also covers the embodiment wherein first impedance 412;428 and second impedance 414;430 are fabricated on the substrate along with the amplifier circuit.

Conclusion

Benefits of the present invention are, at least, and by way of example and not limitation, the following:

Use of inexpensive external components (surface mount ferrites or inductors) which raise the DC voltage on each gain stage output, while having little or no effect on AC performance.

The inclusion of an internal resistor-capacitor circuit that causes the currents and voltages inside the chip to be reduced, thus avoiding damage to the chip, should one or both of the external ferrites or inductors be missing.

Little change to original internal circuitry of the chip is required, with the exception of a simple resistor-capacitor circuit to prevent damage.

No common mode output voltage control circuits are required. The outputs are always connected to $V_{DD}$.

Ferrites or inductors allow the output voltage to swing above and below the bias voltage for more dynamic range.

This application can be used with cable modems, TV tuners, and set-top boxes.

This chip is a variable gain, low noise amplifier with a specified input match.

While various embodiments of the present invention have been described above, it should be understood that they have been presented by way of example only, and not limitation. For example, while the invention has been described in terms of differential pair amplifiers, one skilled in the art would recognize that the instant invention could be applied to single output amplifiers. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the claims and their equivalents.

What is claimed is:

1. An electronic circuit assembly, comprising;
   an electronic circuit;
   a first impedance;
   a second impedance;
   wherein said electronic circuit has a positive output connected to a bias voltage through said first impedance, and a negative output connected to said bias voltage through said second impedance: and
   means for raising a DC voltage at said positive output and said negative output without substantially effecting AC performance of said electronic circuit;
   wherein said electronic circuit is disposed on a common substrate, and said means for raising said DC voltage is disposed external to said common substrate.

2. The electronic circuit assembly of claim 1, wherein said means for raising said DC voltage includes a first off-chip impedance and a second off-chip impedance.

3. The electronic circuit assembly of claim 2, wherein said first off-chip impedance is a first off-chip inductor and said second off-chip impedance is a second off-chip inductor.

4. The electronic circuit assembly of claim 2, wherein said first off-chip impedance is a first ferrite bead and said second off-chip impedance is a second ferrite bead.

5. The electronic circuit assembly of claim 1, wherein said electronic circuit is an amplifier.

6. The electronic circuit assembly of claim 5, wherein said amplifier is comprised of a plurality of amplifier circuit assemblies, each of said plurality of amplifier circuit assemblies having a positive amplifier output and a negative amplifier output, each said positive amplifier outputs being combined into said positive output and each said negative amplifier outputs being combined into said negative output.

7. A method of extending dynamic range of an output of an electronic circuit having a positive output and a negative output, wherein a first on-chip impedance is connected between said positive output and a bias voltage of said electronic circuit and a second on-chip impedance is connected between said negative output and said bias voltage, comprising the steps of:

(1) connecting a first off-chip impedance between said positive output and the bias voltage; and
(2) connecting a second off-chip impedance between said negative output and said bias voltage, said bias voltage raising a DC voltage level at said positive and negative outputs through said corresponding first and second off-chip impedances.

8. The method of claim 7, further comprising the steps of:
(3) connecting a common resistor between said bias voltage of said electronic circuit and a resistor port, wherein said resistor port is further connected to said first on-chip impedance and said second on-chip impedance; and
(4) connecting a common capacitor between said resistor port and a ground.

9. The method of claim 8, wherein said first on-chip impedance is a first reactive load and said second on-chip impedance is a second reactive load.

10. The method of claim 7, wherein at least one of said first off-chip impedance and said second off-chip impedance is a ferrite bead.

11. An electronic circuit assembly, comprising:
   a substrate;
   an electronic circuit disposed on said substrate, and
   an on-chip impedance disposed on said substrate, wherein
   said electronic circuit has an output connected to a bias voltage through said on-chip impedance, and
   said output further being connected to said bias voltage through an off-chip impedance that is disposed external to said substrate, wherein said off-chip impedance raises a DC voltage of said output.

12. The electronic circuit assembly of claim 11, wherein said on-chip impedance is comprised of an inductor and a resistor.

13. The electronic circuit assembly of claim 11, wherein said off-chip impedance is an off-chip inductor.

14. The electronic circuit assembly of claim 11, wherein said off-chip impedance is a ferrite bead.

15. The electronic circuit assembly of claim 11, further comprising a common point resistor, wherein said common point resistor has a first port and a second port, said first port being connected to said bias voltage, and said second port being connected through said on-chip impedance to said output of said electronic circuit.

16. The electronic circuit assembly of claim 11, wherein said second port of said common point resistor is further connected through a common capacitor to a second potential, wherein said second potential is substantially equal to a ground at a desired operating frequency range.

17. The electronic circuit assembly of claim 11, wherein said electronic circuit is used in a cable modem.

18. The electronic circuit assembly of claim 11, wherein said electronic circuit is used in a set-top box.

19. The electronic circuit assembly of claim 11, wherein said electronic circuit is used in a television tuner.

* * * * *

UNITED STATES PATENT AND TRADEMARK OFFICE
CERTIFICATE OF CORRECTION

PATENT NO. : 6,952,134 B2
DATED : October 4, 2005
INVENTOR(S) : Lawrence M. Burns et al.

It is certified that error appears in the above-identified patent and that said Letters Patent is hereby corrected as shown below:

Title page,
Item [56], References Cited, U.S. PATENT DOCUMENTS, insert:
-- 3,711,634      01/1973      Portoulas
   5,955,819      09/1999      Takano et al.
   6,462,623      10/2002      Horan et al.
   US-20040195917      10/2004      Rofougaran et al. --.

Signed and Sealed this

Third Day of January, 2006

JON W. DUDAS
*Director of the United States Patent and Trademark Office*